(12) United States Patent
Hugaud et al.

(10) Patent No.: US 10,257,947 B2
(45) Date of Patent: Apr. 9, 2019

(54) HOUSING FOR ELECTRICAL UNIT

(71) Applicant: VEONEER SWEDEN AB, Vargarda (SE)

(72) Inventors: Pascal Hugaud, Le Mesnil le Roi (FR); Thomas Mauger, Enghien les bains (FR)

(73) Assignee: VEONEER SWEDEN AB, Vargarda (SE)

( * ) Notice: Subject to any disclaimer, the term of this patent is extended or adjusted under 35 U.S.C. 154(b) by 30 days.

(21) Appl. No.: 15/537,681

(22) PCT Filed: Dec. 15, 2015

(86) PCT No.: PCT/EP2015/079837
§ 371 (c)(1),
(2) Date: Jun. 19, 2017

(87) PCT Pub. No.: WO2016/096882
PCT Pub. Date: Jun. 23, 2016

(65) Prior Publication Data
US 2017/0367199 A1     Dec. 21, 2017

(30) Foreign Application Priority Data
Dec. 19, 2014  (SE) ...................................... 1451604

(51) Int. Cl.
*H05K 5/00*       (2006.01)
*H05K 7/12*       (2006.01)

(52) U.S. Cl.
CPC ......... *H05K 5/0047* (2013.01); *H05K 5/0013* (2013.01); *H05K 7/12* (2013.01)

(58) Field of Classification Search
CPC ....... H05K 5/0047; H05K 7/12; H05K 5/0013
See application file for complete search history.

(56) References Cited

U.S. PATENT DOCUMENTS

| | | | | |
|---|---|---|---|---|
| 2,541,828 | A * | 2/1951 | Peck ........................ | H05K 7/12 165/80.3 |
| 2,656,577 | A * | 10/1953 | Carbary ................. | F16B 9/023 192/21.5 |
| 2,868,489 | A * | 1/1959 | Calcut ................... | F16B 5/0685 24/304 |

(Continued)

FOREIGN PATENT DOCUMENTS

WO    WO 2013/002684 A1    1/2013

OTHER PUBLICATIONS

International Search Report and Written Opinion of PCT/EP2015/079837, dated Mar. 21, 2016.

*Primary Examiner* — Binh B Tran
*Assistant Examiner* — Douglas R Burtner
(74) *Attorney, Agent, or Firm* — Brinks Gilson & Lione

(57) ABSTRACT

An electrical unit (1) having a housing (5) having a first wall (7) and a circuit board (3) mounted inside the housing (5), wherein an inner side (7a) of the first wall (7) is provided with a mounting arrangement (17) for holding an electrical component (45).
An outer side (7b) of the first wall (7) is provided with a disassembling marking (53, 55, 57) which corresponds to an outer boundary (65, 67, 69) of a mounting arrangement foundation designating a portion of the first wall which may be cut or removed upon disassembly of the electrical unit (39, 41, 43).

8 Claims, 3 Drawing Sheets

(56) References Cited

U.S. PATENT DOCUMENTS

| | | | | |
|---|---|---|---|---|
| 4,575,038 | A * | 3/1986 | Moore | H05K 7/12 |
| | | | | 248/316.7 |
| 5,117,330 | A * | 5/1992 | Miazga | H05K 3/301 |
| | | | | 174/138 G |
| 6,163,460 | A * | 12/2000 | Baur | H01G 2/04 |
| | | | | 361/752 |
| 6,300,564 | B1 * | 10/2001 | Moraes | H05K 5/0247 |
| | | | | 174/535 |
| 6,717,797 | B1 * | 4/2004 | Martin | H05K 7/12 |
| | | | | 174/559 |
| 9,854,683 | B2 * | 12/2017 | Hassler | H05K 3/00 |
| 2005/0278925 | A1 * | 12/2005 | Murillo, Jr. | H01R 13/635 |
| | | | | 29/426.4 |
| 2011/0115349 | A1 * | 5/2011 | Dernier | H05K 5/0013 |
| | | | | 312/223.1 |
| 2014/0177177 | A1 * | 6/2014 | Huang | H05K 3/225 |
| | | | | 361/748 |
| 2014/0290142 | A1 * | 10/2014 | Dernier | H05K 5/0013 |
| | | | | 49/463 |
| 2015/0145390 | A1 * | 5/2015 | Schwab | H05K 5/0004 |
| | | | | 312/236 |
| 2017/0110815 | A1 * | 4/2017 | Xiao | H05K 7/12 |
| 2017/0311467 | A1 * | 10/2017 | Anderson, III | H05K 5/061 |
| 2018/0132555 | A1 * | 5/2018 | Gonzalez | A45F 5/021 |
| 2018/0249133 | A1 * | 8/2018 | Thiel | H04N 7/185 |

* cited by examiner

HOUSING FOR ELECTRICAL UNIT

CROSS-REFERENCE TO RELATED APPLICATIONS

This application is a 35 U.S.C. § 371 National Phase Application of PCT/EP2015/079837, filed Dec. 15, 2015, which claims the benefit of priority to Swedish Patent Application Serial Number SE 1451604-1, filed Dec. 19, 2014, the contents of which are incorporated herein by reference in their entirety.

FIELD OF THE INVENTION

The present invention relates to an electrical unit having a housing having a first wall and a circuit board mounted inside the housing, wherein an inner side of the first wall is provided with a mounting arrangement for holding an electric component.

BACKGROUND ART

In several technical fields, for instance in the control of electrical system on board a motor vehicle, it is desirable to provide a sealed non-conductive (e.g. plastic) housing containing a printed circuit board, onto which are mounted several electrical components.

An electrical unit of this type is disclosed in WO 2013/006103. However, inspection of such an electrical unit after it has been assembled may be considered complicated when constructed in accordance with the previously noted reference.

SUMMARY OF THE INVENTION

It is an object of the present invention to provide an improved electrical unit which enables easy inspection of the electrical components thereof.

This and other objects that will be apparent from the following summary and description are achieved by an electrical unit as described herein.

According to an aspect of the present invention, there is provided an electrical unit including a housing having a first wall and a circuit board mounted inside the housing, wherein an inner side of the first wall is provided with a mounting arrangement for holding an electrical component, and wherein an outer side of first wall is provided with a disassembling marking which corresponds to an outer boundary of a mounting arrangement foundation.

After assembling an electrical unit it may form a sealed unit. It may be difficult to open an assembled unit for inspection purposes without destroying the electrical circuit thereof, since the electrical component holded by the mounting arrangement is connected to the printed circuit board. Inspection may be needed in different situations, e.g. in conjunction with inspection, after a crash event, of an electrical unit that is fitted into a motor vehicle. In order to allow such inspection a wall of the housing is preferably separated from the other parts of the housing. Separating a wall, which is provided with a mounting arrangement for an electrical component, from the electrical component by pulling it away therefrom may damage components of the electrical unit and/or the electrical circuit thereof.

The first wall of an electrical unit according to the present disclosure may be released in a controlled manner by destroying the retaining function of the mounting arrangement. The disassembling marking indicates where, on the inside of the wall, a foundation of the mounting arrangement is located, and forms a cutting pattern indicating where to cut or remove material in order to destroy the retaining function of the mounting arrangement without damaging other components. The disassembling marking thus enables the mounting arrangement to be loosened and the electrical unit to be opened in a controlled and reliable manner without destroying the electrical circuit thereof. The retaining function of the mounting arrangement may, e.g., be destroyed by cutting along a cutting pattern formed by the disassembling marking.

According to one embodiment the mounting arrangement includes at least one pair of clips projecting from the inner side of the first wall.

According to one embodiment the mounting arrangement includes at least one resilient clip.

According to one embodiment the disassembling marking includes at least one recess formed in the first wall.

According to one embodiment the disassembling marking includes a protrusion projecting from the inner side of the first wall.

According to one embodiment the disassembling marking includes a line, such as a printed or painted line.

According to one embodiment the first wall is a cover of the housing.

According to one embodiment the first wall is made of plastic and the other parts of the housing are made of metal, which provides for a robust housing that blocks electromagnetic radiation.

According to one embodiment the housing is made of plastic.

According to one embodiment the mounting arrangement is formed integrally with the first wall.

According to another aspect of the present disclosure, there is provided a method of opening an electrical unit, the electrical unit-including a housing having a first wall and a circuit board mounted inside said housing, wherein an inner side of the first wall is provided with a mounting arrangement for holding an electrical component. —The method including the steps of cutting along a cutting pattern arranged on the outer side of the first wall and corresponding to an outer boundary of a mounting arrangement foundation, until the retaining function of the mounting arrangement is destroyed, and removing the first wall to allow inspection of at least one electrical component of the electrical unit.

The cutting marking indicates where the mounting arrangement is located on the inside of the wall and thus where to cut in order to destroy the retaining function of the mounting arrangement. After destroying the retaining function of the mounting arrangement the wall may easily be removed to enable inspection of the electrical unit. This method allows inspection of the electrical circuit of the electrical unit to be carried out in a controlled and reliable manner without destroying components and/or the electrical circuit thereof.

According to one embodiment, the cutting is carried out by cutting along a cutting pattern defined by an outer boundary of a recess formed in the first wall. The cutting may thus be carried out under the guidance of an outer boundary of a recess formed on the outer side of the first wall.

These and other aspects of the invention will be apparent from and elucidated with reference to the claims and the embodiments described hereinafter.

BRIEF DESCRIPTION OF THE DRAWINGS

The invention will hereafter be described in more detail and with reference to the appended schematic drawings.

FIG. 3a is a perspective view of a cover and an electrical component of the electrical unit shown in FIG. 2a.

DETAILED DESCRIPTION OF PREFERRED EMBODIMENTS OF THE INVENTION

Figure 1A:
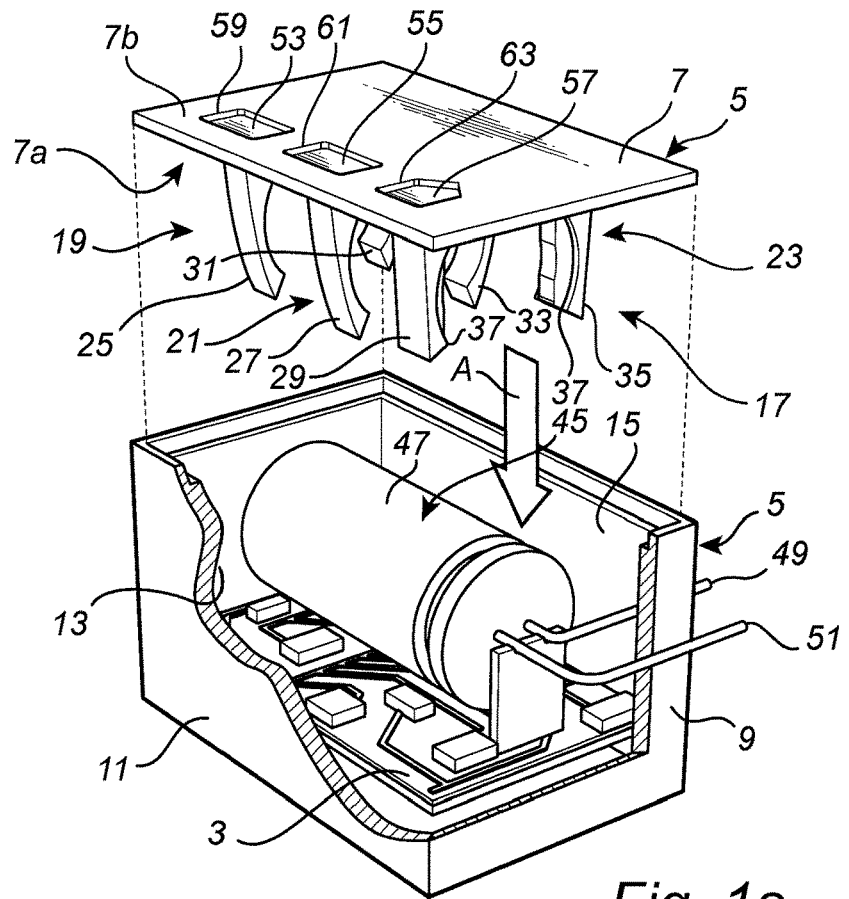
FIG. 1a is a perspective view of an electrical unit according to an embodiment of the present disclosure about to be assembled.
Figure 1B:
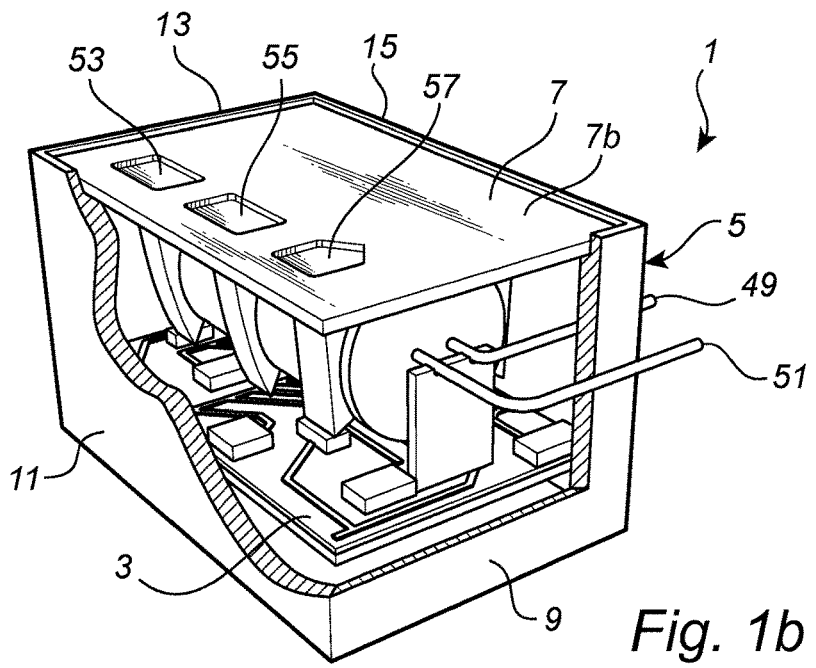
FIG. 1b is a perspective view of an electrical unit according to an embodiment of the present disclosure in an assembled state.

FIGS. 1a and 1b illustrate an electronic unit 1 according to an embodiment of the present disclosure. The electronic unit 1 includes a printed circuit board (PCB) 3 and a housing 5. The electronic unit 1 may be a part of a control system in a motor vehicle. The PCB 3 is of an ordinary kind, including conductive tracks and component connections. The PCB 3 may have one or several conductive layers, where some layers may—include conductive tracks and some layers may comprise ground planes.

The housing 5—includes a first wall, in the form of a cover 7, and five further walls in the form of four side walls 9, 11, 13, and 15 and one bottom wall.

Figure 3A:
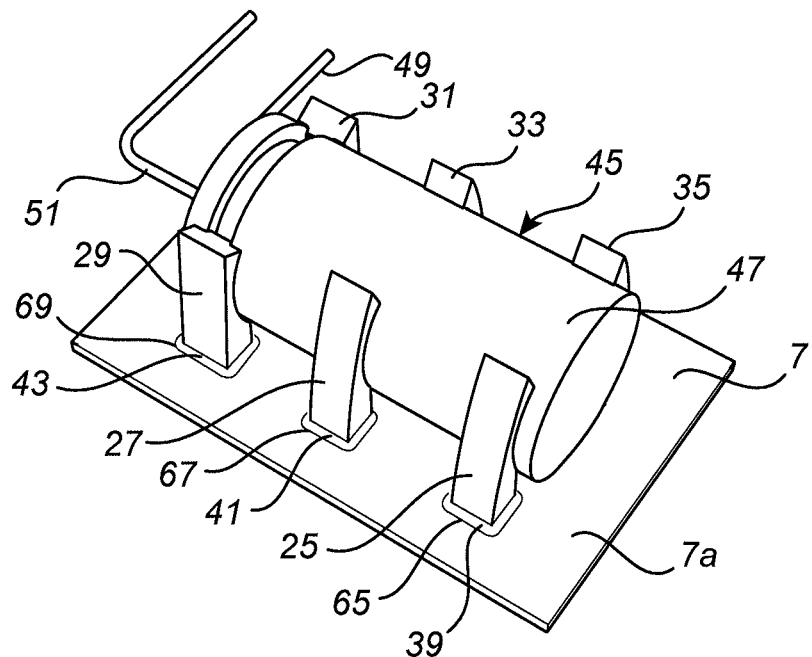

The inner side 7a of the cover 7 is provided with a mounting arrangement 17 including three pairs of clips 19, 21, and 23. Each pair of clips 19, 21, and 23 includes a first 25, 27, and 29 and a second clip 31, 33, and 35, respectively, projecting from the inner side 7a of the cover 7. Each clip in a pair of clips includes a foundation, i.e. a base portion, and a substantially rectangular body, which is arranged to be generally perpendicular to the inner surface of the cover 7, and each of the clips in a pair of clips has a protruding lip 37 at or near the free end thereof, which protrudes towards the other one of the pair of clips. Hence, as illustrated in FIG. 3a, the first clip 25 of the first pair of clip 19 includes a foundation 39, the first clip 27 of the second pair of clips 21 includes a foundation 41 and the first clip 29 of the third pair of clips 23 includes a foundation 43. The clips 25, 27, 29, 31, 33, and 35 of the mounting arrangement 17 are preferably formed from a sturdy, resilient, non-conductive material, such as, e.g, plastic, and may be formed integrally with the cover 7.

The electrical unit 1 further includes a capacitor 45 having a relatively large, substantially cylindrical body 47 and two electrically contact pins 49, 51 protruding therefrom. It is noted that cylindrical body 47 can form other electrical circuit elements in addition to that of capacitor.

The mounting arrangement 17, which includes the three pairs of clips 19, 21, and 23, is adapted to receive and retain the capacitor 45. The dimensions and spacing between the three pairs of clips 17, 19, and 21 are such that the body 47 of the capacitor 45 may be pushed between them, contacting the lips 37 thereof so that, upon assembly of the electrical unit 1, the clip pair are deflected and forced apart, and then allowed to return to their initial positions once the body 47 of the capacitor 45 has been pushed past the lips 37. The capacitor 45 is then held in place being trapped between the inner surface of the cover 7 and the clips 19, 21, and 23, and being prevented from becoming detached from the mounting arrangement 17 by the protruding lips 37 of the clips 25, 27, 29, 31, 33, and 35 thereof.

Figure 2A:
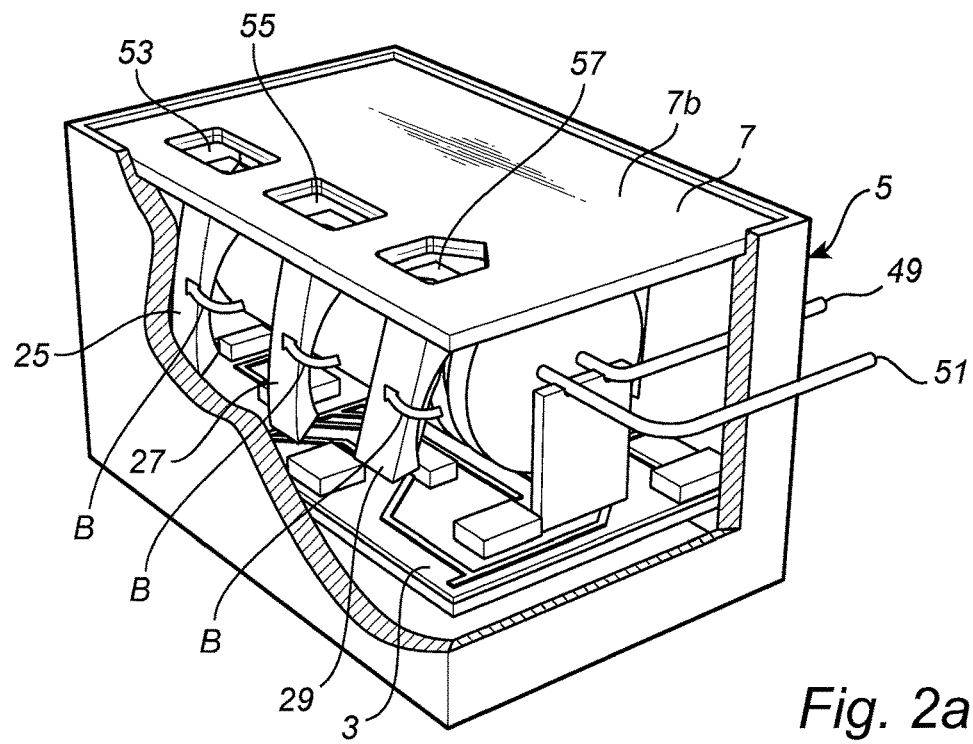
FIGS. 2a-b are perspective views illustrating opening of the electronic unit shown in FIG. 1.
Figure 2B:
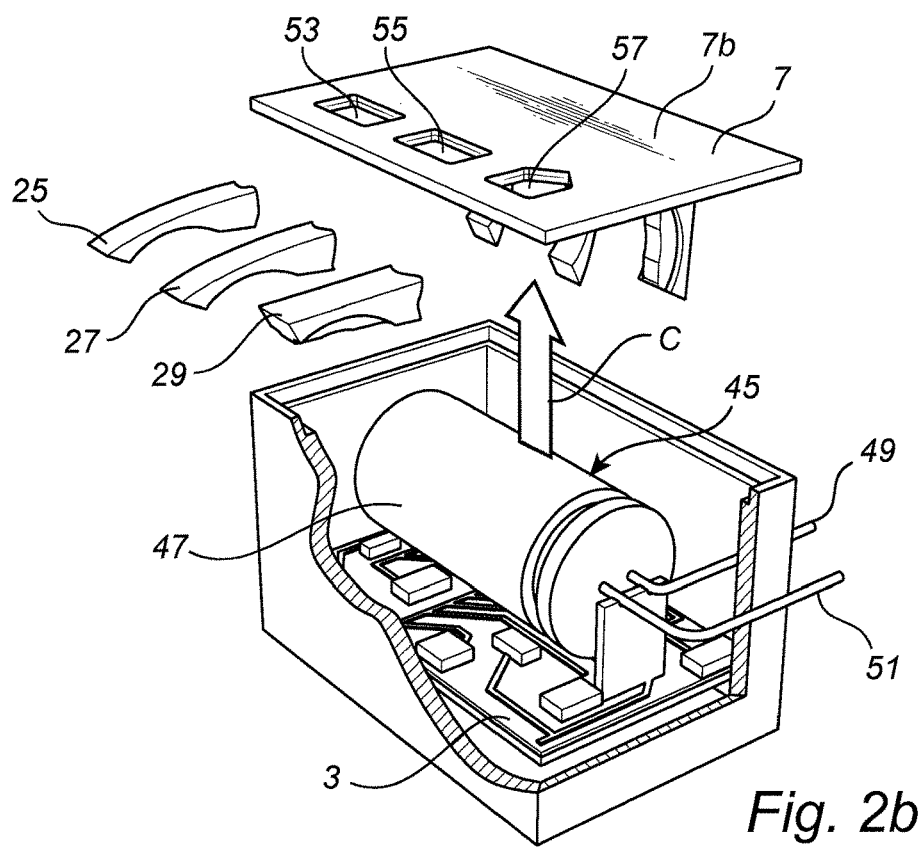

In FIGS. 1a.b and FIGS. 2a-b parts of two of the side walls 9, 11, 13, and 15 of the housing 5 have been removed to visualize the inside of the housing 5.

The PCB 3 may be conventional, having a substrate of a semiconductor material, having electrical components mounted thereto, with conductive tracks being provided on one or both major surfaces of the PCB to connect the components to one another.

The outer side 7b of the cover 7 is provided with three disassembling markings in the form of recesses 53, 55, and 57. Each disassembling marking 53, 55, and 57 corresponds to an outer clip foundation boundary 65, 67, and 69, respectively. Hence, the periphery 59, 61, and 63, i.e the outer boundary, of each disassembling marking 53, 55, and 57, respectively, corresponds to a respective clip foundation boundary 65, 67, and 69, illustrated in FIG. 3a. Hence, the first disassembling marking 53 corresponds to the first clip foundation periphery 65, the second disassembling marking 55 corresponds to the second clip foundation periphery 67 and the third disassembling marking 57 corresponds to the third clip foundation periphery 69.

Each disassembling marking 53, 55, and 57 thus indicates where a clip of the mounting arrangement 17 is located on the inner side 7a of the cover 7.

Furthermore, each disassembling marking 53, 55, and 57 forms a cutting pattern 59, 61, and 63, respectively, indicating where to cut in order to destroy the retaining function of retaining clips.

Upon assembly of the electrical unit 1 the cover 7 is pushed onto the capacitor 45, as illustrated by arrow A in FIG. 1a. Then, the cover 7 is placed on the side walls 9, 11, 13, and 15. When the electrical unit 1 is assembled, the side walls 9, 11, 13, and 15 and the cover 7 form a sealed unit together with the bottom wall of the housing 5.

After assembly of the electrical unit 1 the cover 7 is attached to the capacitor 45 and side walls 9, 11, 13, and 15 in a robust manner. Then, in case the assembled electrical unit need to be inspected, the disassembling markings enables opening of the assembled electrical unit.

The cover 7 may be released from the capacitor 45 by destroying the retaining function of the mounting arrangement 17. The retaining function of a pair of clips of the mounting arrangement 17 may be destroyed by a cutting operation from the outside of the cover 7. The cutting patterns 59, 61, and 63 formed by the disassembling markings 53, 55, and 57 serve to facilitate such an operation by indicating where one clip 25, 27, and 29 of each pair of clips 19, 21, and 23, respectively, are located on the inner side 7a of the cover 7, and, hence, where to cut in order to loose these clips 25, 27, and 29. After such a cutting operation the cover 7 may easily be released from the capacitor 45 and removed therefrom, which enables inspection of the electronic circuit of the electrical unit 1. The cutting patterns 59, 61, and 63 thus enables the electrical unit 1 to be opened without destroying the electrical circuit thereof.

With reference to FIGS. 2a-b opening of the electrical unit 1 will be described hereinafter. FIG. 3a shows the cover 7 and capacitor 45 of the assembled electrical unit 1 shown in FIG. 1b.

In a first step, a cutting operation is carried out to release the cover 7 from its connection to the capacitor 45. The cutting operation involves cutting along cutting patterns 59, 61, and 63, illustrated in FIG. 1a, on the outer side 7b of the cover 7. Each cutting pattern 59, 61, and 63 corresponds to a respective clip foundation boundary on the inner side 7a of the cover 7, as described hereinbefore. Cutting is carried out until the retaining function of the mounting arrangement 17 is destroyed, i.e. until one clip of each pair of clips is released from the cover 7, as schematically illustrated by arrow B in FIG. 2a. It is realized that such a cutting operation may be carried out in many different ways. For instance, the cutting operation may involve removing material by drilling and/or milling. The cover 7 is thus released from its connection to the capacitor 45 by destruction of one retaining clip of each pair of clips of the mounting arrangement 17.

In a second step, the cover 7 is separated from the sidewalls 9, 11, 13, and 15 of the housing 5, as illustrated by arrow C in FIG. 2b. In the second step, the cover 7 is thus removed from the other parts of the housing 5. Then, inspection of the electrical circuit inside the housing 5 is enabled.

Figure 3B:
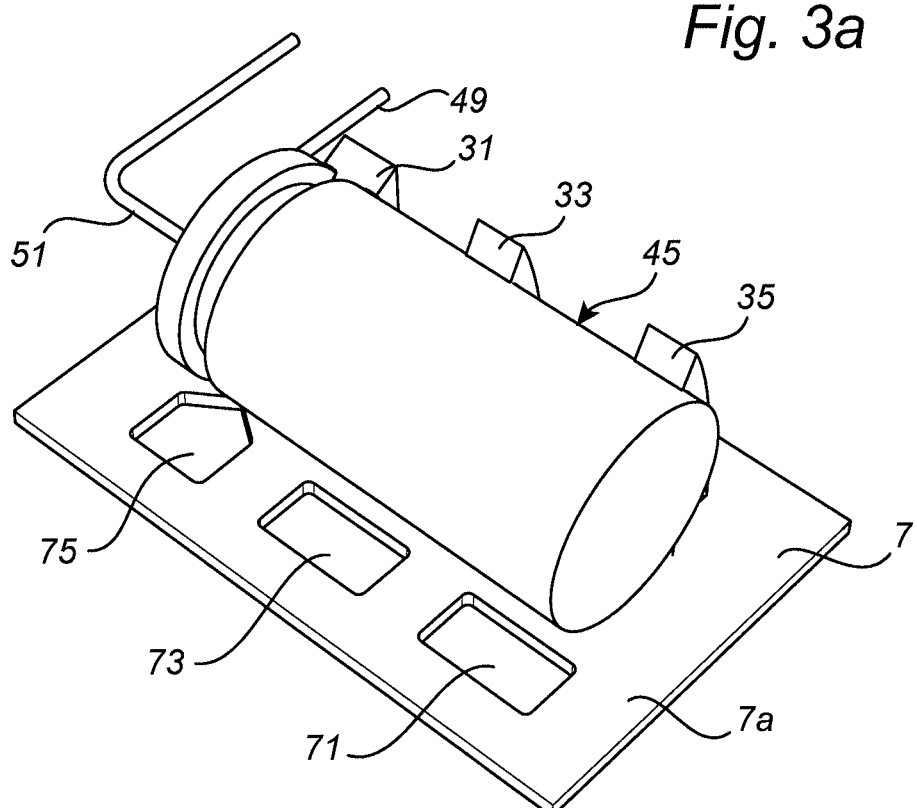
FIG. 3b is a perspective view illustrating the cover shown in FIG. 3a after a cutting operation.

In conjunction with the cutting operation, three through holes 71, 73, and 75, illustrated in FIG. 3b, are formed in the cover 7.

Hence, a method of opening an electrical unit 1 of the type described hereinbefore with reference to FIGS. 1a-b comprises cutting along at least one cutting pattern 59, 61, and 63 arranged on the outer side 7b of a first wall 7 of the housing 5 and corresponding to an outer boundary of a mounting arrangement foundation 39, 41, and 43, until the retaining function of the mounting arrangement 17 is destroyed, and removing the first wall 7 to allow inspection of at least one electrical component 45 of the electrical unit 1.

It is realized by a person skilled in the art that features from various embodiments disclosed herein may be combined with one another in order to provide further alternative embodiments.

As described hereinbefore with reference to FIGS. 1a-b, the electrical unit of the present disclosure comprises a first wall in the form of a cover 7. It is however appreciated that the first wall may be any of the walls of the housing. For instance, the first wall may be a bottom wall of the housing.

As described hereinbefore with reference to FIGS. 1a-b, an outer side of the cover 7 is provided with disassembling markings in the form of recesses. It is however realized that a disassembling marking of the electrical unit may be in the form of a protrusion or a line, such as a printed or painted line.

While the above description constitutes the preferred embodiment of the present invention, it will be appreciated that the invention is susceptible to modification, variation, and change without departing from the proper scope and fair meaning of the accompanying claims.

The invention claimed is:

1. An electrical unit comprising;
   a housing having a first wall,
   a circuit board mounted inside the housing,
   wherein an inner side of the first wall is provided with a mounting arrangement for holding an electrical component, wherein the mounting arrangement comprises at least one pair of clips projecting from the inner side of the first wall; and
   an outer side of the first wall is provided with a disassembling marking formed as a cutting pattern which corresponds to an outer boundary of a mounting arrangement foundation and designating portions integrally formed with the first wall which may be cut or removed to release the electrical component.

2. An electrical unit according to claim 1, wherein the at least one pair of clips is in the form of at least one pair of resilient clips.

3. An electrical unit according to claim 1, wherein the disassembling marking comprises at least one recess formed in the first wall.

4. An electrical unit according to claim 1, wherein the disassembling marking further comprises a protrusion projecting from the inner side of the first wall.

5. An electrical unit according to claim 1, further comprising the first wall is a cover of the housing.

6. An electrical unit according to claim 1, further comprising the first wall is made of plastic and one or more other parts of the housing are made of metal.

7. An electrical unit according to claim 1, further comprising the housing is made of plastic.

8. An electrical unit according to claim 1, further comprising the mounting arrangement is formed integrally with the first wall.

* * * * *